US012666607B2

(12) United States Patent (10) Patent No.: US 12,666,607 B2
Ahn et al. (45) Date of Patent: Jun. 23, 2026

(54) SEMICONDUCTOR DEVICE

(71) Applicant: Samsung Electronics Co., Ltd.,
Suwon-si (KR)

(72) Inventors: Junhyeok Ahn, Suwon-si (KR);
Myeongdong Lee, Suwon-si (KR)

(73) Assignee: Samsung Electronics Co., Ltd.,
Gyeonggi-do (KR)

( * ) Notice: Subject to any disclaimer, the term of this
patent is extended or adjusted under 35
U.S.C. 154(b) by 399 days.

(21) Appl. No.: 18/346,942

(22) Filed: Jul. 5, 2023

(65) Prior Publication Data

US 2024/0172426 A1 May 23, 2024

(30) Foreign Application Priority Data

Nov. 22, 2022 (KR) ........................ 10-2022-0157526

(51) Int. Cl.
H10B 12/00 (2023.01)
(52) U.S. Cl.
CPC ........... H10B 12/488 (2023.02); H10B 12/34
(2023.02)
(58) Field of Classification Search
CPC .... H10B 12/053; H10B 12/31; H10B 12/315;
H10B 12/34; H10B 12/488
See application file for complete search history.

(56) References Cited

U.S. PATENT DOCUMENTS

| | | | |
|---|---|---|---|
| 8,022,472 B2 | 9/2011 | Yagi et al. | |
| 10,615,164 B2 | 4/2020 | Kim et al. | |
| 11,177,264 B2 | 11/2021 | Jeon et al. | |
| 11,329,050 B2 | 5/2022 | Seong et al. | |
| 2002/0000580 A1* | 1/2002 | Okashita | H10D 30/601 |
| | | | 257/E29.268 |
| 2011/0156135 A1 | 6/2011 | Yoon et al. | |
| 2016/0315088 A1 | 10/2016 | Kang et al. | |
| 2020/0168611 A1* | 5/2020 | Jeon | H10B 12/482 |

FOREIGN PATENT DOCUMENTS

| | | | | |
|---|---|---|---|---|
| KR | 20100109049 A | * 10/2010 | ......... | H01L 21/2253 |
| KR | 2010/0119446 A | 11/2010 | | |

* cited by examiner

*Primary Examiner* — Britt Hanley
*Assistant Examiner* — Kevin Quinto
(74) *Attorney, Agent, or Firm* — HARNESS, DICKEY &
PIERCE, P.L.C.

(57) ABSTRACT

A semiconductor device may include a device isolation layer
on a substrate and defining an active region; and a word line
structure in a gate trench defined by the device isolation
layer and the active region. The word line structure may
include a word line on a gate dielectric layer. The word line
may include a second material layer including a doped
semiconductor material on a first material layer, may have a
first region having a first width and a second region having
a second width, which may be wider than the first width. The
second material layer may include a first material portion in
the first region and a second material portion in the second
region. The doped semiconductor material may be a first
concentration in the first material portion and a second
concentration in the second material portion, which may be
lower than the first concentration.

18 Claims, 14 Drawing Sheets

B

SEMICONDUCTOR DEVICE

CROSS-REFERENCE TO RELATED APPLICATION(S)

This application claims the benefit of priority to Korean Patent Application No. 10-2022-0157526 filed on Nov. 22, 2022 in the Korean Intellectual Property Office, the disclosure of which is incorporated herein by reference in its entirety.

BACKGROUND

Inventive concepts relate to a semiconductor device.

Electronic devices are being further miniaturized and implemented with high performance, according to the development of the electronics industry and the needs of users. Accordingly, semiconductor devices used in electronic devices also may be required to be highly integrated and have high performance. In order to manufacture highly scaled-down semiconductor devices, contact technologies for stably connecting adjacent conductive structures while limiting and/or minimizing resistance between adjacent conductive structures may be required.

SUMMARY

An aspect of inventive concepts is to provide a semiconductor device having improved productivity.

According to an embodiment of inventive concepts, a semiconductor device may include a substrate including an active region; a device isolation layer on the substrate and defining the active region; and a word line structure crossing the active region and the device isolation layer. The word line structure may be in a gate trench extending in a first horizontal direction. The gate trench may be defined by the device isolation layer and the active region. The word line structure may include a gate dielectric layer and a word line. The gate dielectric layer may be on an inner wall of the gate trench. The word line may be on the gate dielectric layer and may partially fill the gate trench. The word line may include a first material layer and a second material layer on the first material layer. The second material layer may include a doped semiconductor material. The word line may have a first region having a first width and a second region having a second width. The second width may be wider than the first width. The second material layer may include a first material portion in the first region and a second material portion in the second region. The doped semiconductor material of the second material layer may be a first impurity concentration in the first material portion and a second impurity concentration in the second material portion. The second impurity concentration may be lower than the first impurity concentration.

According to an embodiment of inventive concepts, a semiconductor device may include a substrate including an active region, the active region including a first impurity region and a second impurity region; a device isolation layer on a side surface of the active region, the device isolation layer and the active region defining gate trenches crossing the active region and the device isolation layer, the gate trenches extending in a first horizontal direction; word line structures including word lines in the gate trenches; a bit line structure crossing the word lines and electrically connected to the first impurity region, a height level of the bit line structure being different from height levels of the word lines; a storage node contact electrically connected to the second impurity region; and an information storage structure electrically connected to the storage node contact. The gate trenches may include a first gate trench and a second gate trench. The word lines may include a first word line in the first gate trench and a second word line in the second gate trench. The first word line may include a first doped material having a first impurity concentration in a region having a first width. The second word line may include a second doped material having a second impurity concentration in a region having a second width. The second impurity concentration may be lower than the first impurity concentration, and the second width may be wider than the first width.

According to an embodiment of inventive concepts, a semiconductor device may include a substrate including a plurality of active regions, the substrate including gate trenches partially recessed from an upper portion of the substrate and extending in a first horizontal direction; dielectric patterns on an inner side wall of each of the gate trenches; first gate electrode patterns on the dielectric patterns in the gate trenches, the first gate electrode patterns including a metal material; second gate electrode patterns on the first gate electrode patterns in the gate trenches, the second gate electrode patterns having a semiconductor material including an impurity; and gate capping patterns on the second gate electrode patterns in the gate trenches. The second gate electrode patterns may have a first region and a second region. The first region may have a first width. The second region may have a second width. The second width may be wider than the first width. An impurity in the first region may be identical to an impurity of the second region. An impurity concentration in the first region may be different from an impurity concentration in the second region.

BRIEF DESCRIPTION OF DRAWINGS

The above and other aspects, features, and effects of inventive concepts will be more clearly understood from the following detailed description, taken in conjunction with the accompanying drawings, in which:

FIG. 2 illustrates cross-sectional views of FIG. 1, taken along lines I-I' and II-II'.

FIG. 3 is an enlarged view of portion 'A' of FIG. 2.

FIG. 7 illustrates regions corresponding to cross-sectional views of FIG. 1, taken along lines I-I' and II-II'.

FIG. 8 is an enlarged view of a region corresponding to portion 'A' of FIG. 2.

DETAILED DESCRIPTION

Hereinafter, terms such as "upper," "intermediate," "lower," and the like may be replaced with other terms, such as "first," "second," "third," and the like, to be used for describing components of the specification. Terms such as "first," "second," "third," and the like may be used to describe various components, but the components are not limited by the above terms, and "first component" may be named as "the second component."

Hereinafter, with reference to the accompanying drawings, preferred embodiments of inventive concepts will be described as follows.

Figure 1:
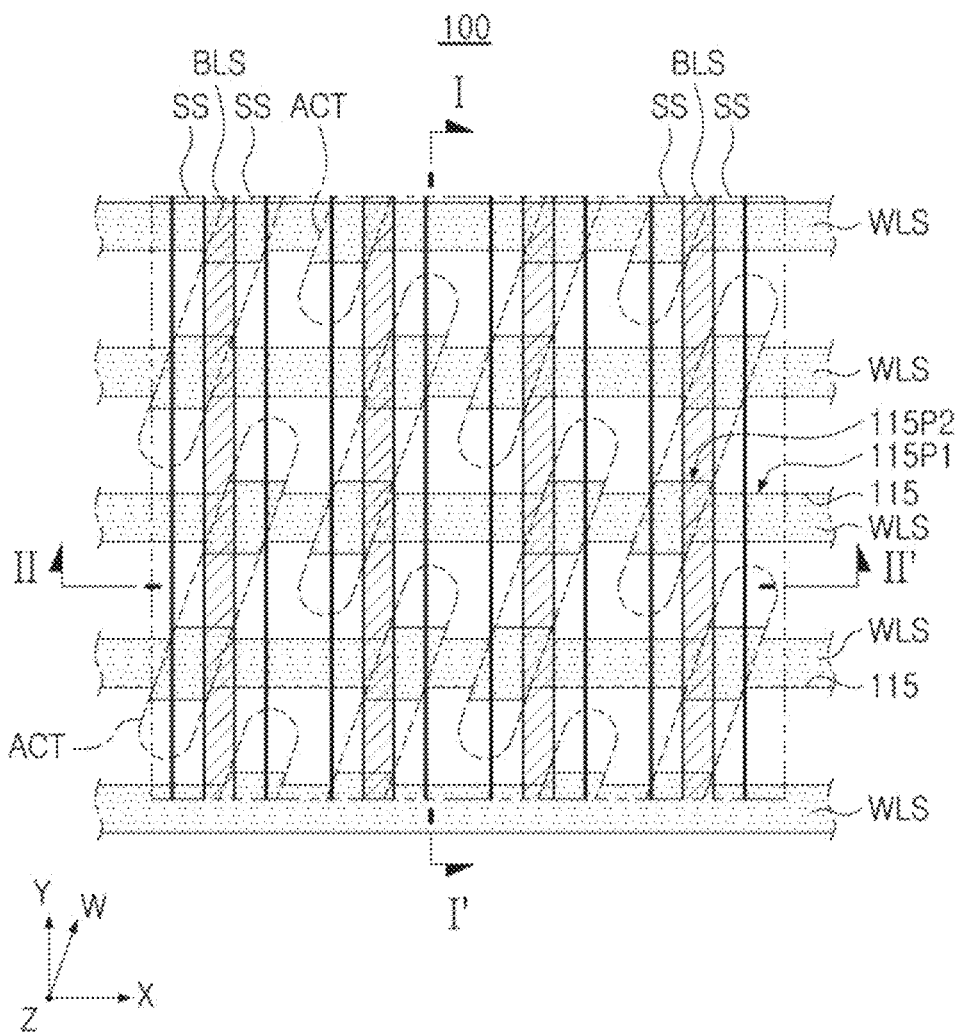
FIG. 1 is a schematic plan view of a semiconductor device according to example embodiments.

FIG. 1 is a schematic plan view of a semiconductor device according to example embodiments.

Figure 2:
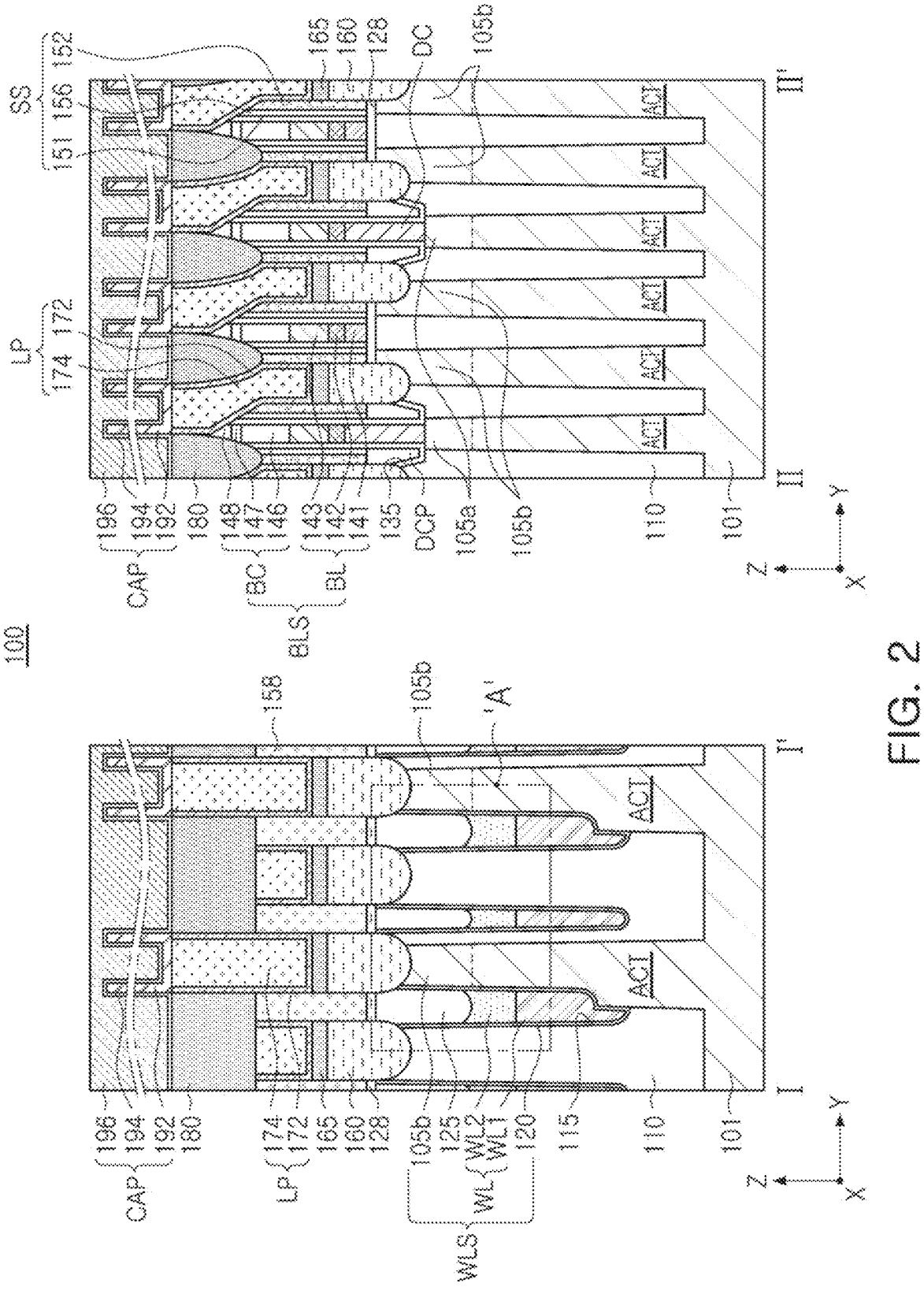
FIG. 2 is schematic cross-sectional views of a semiconductor device according to example embodiments.

FIG. 2 is schematic cross-sectional views of a semiconductor device according to example embodiments. FIG. 2 illustrates cross-sectional views of FIG. 1, taken along lines I-I' and II-II'.

Figure 3:
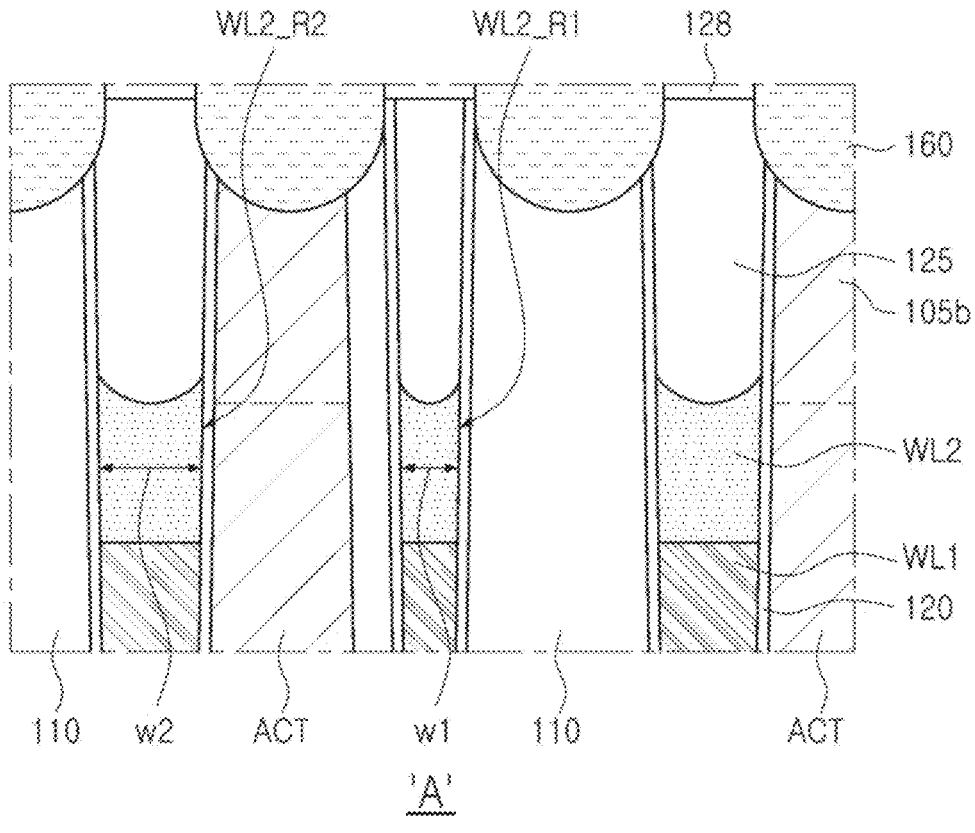
FIG. 3 is a partially enlarged cross-sectional view of a semiconductor device according to example embodiments.

FIG. 3 is a partially enlarged cross-sectional view of a semiconductor device according to example embodiments. FIG. 3 is an enlarged view of portion 'A' of FIG. 2.

Referring to FIGS. 1 to 3, a semiconductor device 100 may include a substrate 101 including a plurality of active regions ACT, word line structures WLS buried and extending in gate trenches 115 in the substrate 101 and respectively including a word line WL, bit line structures BLS extending to cross the word line structures WLS on the substrate 101 and respectively including a bit line BL, an information storage structure CAP disposed on the bit line structures BLS, storage node contacts 160 electrically connecting the information storage structure CAP and the plurality of active regions ACT, landing pad structures LP electrically connecting the storage node contacts 160 and the information storage structure CAP, and a capping insulating layer 180 on the bit line structures BLS. The semiconductor device 100 may further include device isolation layers 110 defining the plurality of active regions ACT, a buffer layer 128 on the substrate 101, spacer structures SS on both sides of the bit line structures BLS, a metal-semiconductor compound layer 165 on the storage node contact 160, and insulating patterns 158 between the bit line structures BLS. The semiconductor device 100 may be applied to, for example, a cell array of a dynamic random access memory (DRAM), but may not be limited thereto.

The substrate 101 may have an upper surface extending in X and Y-directions. The substrate 101 may include a semiconductor material, such as a group IV semiconductor, a group III-V compound semiconductor, or a group II-VI compound semiconductor. For example, the group IV semiconductor may include silicon, germanium, or silicon-germanium. The substrate 101 may further include impurities. The substrate 101 may include a silicon substrate, a silicon on insulator (SOI) substrate, a germanium substrate, a germanium on insulator (GOI) substrate, a silicon-germanium substrate, or a substrate including an epitaxial layer.

The plurality of active regions ACT may be defined in substrate 101 by the device isolation layers 110. Each of the plurality of active regions ACT may have a bar shape, and may be arranged in an island shape extending in one direction, for example, a W direction, in the substrate 101. The W direction may be a direction inclined with respect to an extension direction of the word line WL and an extension direction of the bit line BL.

Each of the plurality of active regions ACT may have first and second impurity regions 105a and 105b having a desired and/or alternatively predetermined depth from the upper surface of the substrate 101. The first and second impurity regions 105a and 105b may be spaced apart from each other. The first and second impurity regions 105a and 105b may be provided as source/drain regions of a transistor formed by the word line WL. For example, a drain region may be formed between two word lines WL crossing one active region ACT, and a source region may be formed outside the two word lines WL, respectively. The source region and the drain region may be formed by the first and second impurity regions 105a and 105b by doping or ion implantation of substantially the same impurities, and may be interchangeably referred to according to a circuit configuration of a finally formed transistor. The impurities may include dopants having a conductivity type opposite to that of the substrate 101. In example embodiments, depths of the first and second impurity regions 105a and 105b in the source region and the drain region may be different from each other.

The device isolation layers 110 may be formed by a shallow trench isolation (STI) process. The device isolation layers 110 may electrically isolate the plurality of active regions ACT from each other while surrounding them. The device isolation layers 110 may be formed of an insulating material, for example, an oxide, a nitride, or a combination thereof.

Each of the word line structures WLS may include a gate dielectric layer 120, a word line WL, and a gate capping layer 125.

The word line WL may be disposed in the gate trenches 115 extending in the substrate 101. A portion of an upper portion of the substrate 101 may be recessed by the gate trenches 115. Each of the gate trenches 115 may cross the plurality of active regions ACT and the device isolation layers 110, and may extend in a first horizontal direction, for example, in the X-direction. The word line WL may be disposed in the gate trenches 115 to extend in the X-direction. For example, a pair of word lines WL may be disposed to cross one active region ACT. The word line WL may constitute a buried channel array transistor (BCAT), but is not limited thereto.

The word line WL may be disposed below each of the gate trenches 115 by a desired and/or alternatively predetermined thickness. An upper surface of the word line WL may be located at a lower level than the upper surface of the substrate 101. In this specification, high and low degrees of the term "level" may be defined based on the upper surface of the substrate 101, which may be substantially flat.

In an example embodiment, the word line WL may include a first material layer WL1 including a conductive material, and a second material layer WL2 on the first material layer WL1. The first material layer WL1 may be formed of a conductive material having lower resistivity than the second material layer WL2, for example, at least one of titanium (Ti), titanium nitride (TiN), tantalum (Ta), tantalum nitride (TaN), tungsten (W), tungsten nitride (WN), or aluminum (Al). The second material layer WL2 may include a material, different from that of the first material layer WL1. The second material layer WL2 may include a doped semiconductor material. The doped semiconductor material may include, for example, silicon (Si) or silicon germanium (SiGe). The doped semiconductor material may include, for example, polycrystalline silicon containing an impurity. The impurity may include phosphorus (P), arsenic (As), or the like. The doped semiconductor material may be referred to as a 'doped material,' 'doped conductive material,' or 'conductive material.'

A thickness of the first material layer WL1 may be thicker than a thickness of the second material layer WL2.

The gate dielectric layer 120 may be disposed on bottom and inner side surfaces of each of the gate trenches 115. The gate dielectric layer 120 may be disposed between the word line WL and the gate trenches 115. The gate dielectric layer 120 may conformally cover an inner side wall of each of the gate trenches 115. The gate dielectric layer 120 may include at least one of an oxide, a nitride, or an oxynitride. The gate dielectric layer 120 may be, for example, a silicon oxide film, or an insulating film having a high dielectric constant. In example embodiments, the gate dielectric layer 120 may be a layer formed by oxidizing the active region ACT, or may be a layer formed by deposition.

The gate capping layer 125 may be disposed to fill each of the gate trenches 115 on the word line WL. An upper surface of the gate capping layer 125 may be located at a level, substantially equal to the upper surface of the substrate 101. The gate capping layer 125 may be formed of an insulating material, for example, a silicon nitride layer.

In this specification, the first material layer WL1 may be referred to as a first gate electrode pattern, the second material layer WL2 may be referred to as a second gate electrode pattern, and the gate dielectric layer 120 may be referred to as a gate dielectric pattern, and the gate capping layer 125 may be referred to as a gate capping pattern.

Referring to FIG. 3, the second material layer WL2 may include a first region WL2_R1 having a first width w1 in the Y-direction, and a second region WL2_R2 having a second width w2, wider than the first width w1. The second material layer WL2 may include a first material portion in the first region WL2_R1, and a second material portion in the second region WL2_R2.

The doped semiconductor material of the second material layer WL2 may have a first impurity concentration in the first material portion, and a second impurity concentration, lower than the first impurity concentration, in the second material portion.

The first impurity concentration may be higher than about $1.0 \times 10^{18}/cm^3$ and lower than or equal to about $1.0 \times 10^{22}/cm^3$, and the second impurity concentration may be higher than or equal to about $1.0 \times 10^{18}/cm^3$ and lower than about $1.0 \times 10^{22}/cm^3$. In an embodiment, the second impurity concentration may be in a range of about $1.0 \times 10^{18}/cm^3$ to about $1.0 \times 10^{20}/cm^3$. An impurity concentration range of the first and second impurity concentrations may be a range for lowering resistivity of the doped semiconductor material.

Under a specific etching condition, a material of the first material portion may include a material having a higher etching rate than that of the second material portion. In an etching process for forming the second material layer WL2, to compensate for an etch loading effect in which an etching rate of a material constituting the second material layer WL2 increases as a width of the gate trenches 115 increases, thickness distribution of the second material layer WL2 may be improved by forming a relatively high impurity concentration in the first region WL1_R1 having a relatively narrow width. Therefore, a semiconductor device 100 having improved reliability and productivity may be provided.

In an example embodiment, each of the gate trenches 115 may include a first trench portion 115P1 having a first width in the Y-direction and extending in the X-direction, and a second trench portion 115P2 having a second width, wider than the first width, and extending in the X-direction. In one gate trench 115, the first trench portion 115P1 may be alternately arranged with the second trench portion 115P2. The first trench portion 115P1 may be a region in which the device isolation layers 110 are recessed, and the second trench portion 115P2 may be a region in which the plurality of active regions ACT are recessed.

In an example embodiment, the first region WL2_R1 may be located in the first trench portion 115P1, and the second region WL2_R2 may be located in the second trench portion 115P2. The first material portion may be adjacent to the device isolation layers 110, and the second material portion may be adjacent to the plurality of active regions ACT. Thus, in one gate trench 115, the first region WL2_R1 and the second region WL2_R2 may be alternately arranged.

In an example embodiment, the second material layer WL2 may further include a third region having a third width, wider than the first width w1 and narrower than the second width w2, and the second material layer WL2 may include a third material portion in the third region. The doped semiconductor material of the second material layer WL2 may have a third impurity concentration, lower than the first impurity concentration and higher than the second impurity concentration, in the third material portion. For example, the third region may be a region located between the first region WL2_R1 and the second region WL2_R2.

Each of the bit line structures BLS may extend in one direction, perpendicular to the word line WL, for example, in the Y-direction. Each of the bit line structures BLS may include a bit line BL and a bit line capping pattern BC on the bit line.

The bit line BL may include a first conductive pattern 141, a second conductive pattern 142, and a third conductive pattern 143, sequentially stacked. The bit line capping pattern BC may be disposed on the third conductive pattern 143. The buffer layer 128 may be disposed between the first conductive pattern 141 and the substrate 101.

The first conductive pattern 141 may include a semiconductor material such as polycrystalline silicon. The second conductive pattern 142 may include a metal-semiconductor compound. The metal-semiconductor compound may be, for example, a layer in which a portion of the first conductive pattern 141 is silicidated. For example, the metal-semiconductor compound may include cobalt silicide (CoSi), titanium silicide (TiSi), nickel silicide (NiSi), tungsten silicide (WSi), or other metal silicides. The third conductive pattern 143 may include a metal material such as titanium (Ti), tantalum (Ta), tungsten (W), or aluminum (Al). The number of conductive patterns constituting the bit line BL, a type of material, and/or a stacking order may be variously changed according to embodiments.

The bit line capping pattern BC may include a first capping pattern 146, a second capping pattern 147, and a third capping pattern 148, sequentially stacked on the third conductive pattern 143. Each of the first to third capping patterns 146, 147, and 148 may include an insulating material, for example, a silicon nitride film. The first to third capping patterns 146, 147, and 148 may be formed of different materials, and even though they include the same material, a boundary may be distinguished due to differences in properties. A thickness of the second capping pattern 147 may be thinner than a thickness of the first capping pattern 146 and a thickness of the third capping pattern 148, respectively. The number of capping patterns constituting the bit line capping pattern BC and/or a type of material may be variously changed according to embodiments.

A bit line contact DC may pass through the buffer layer 128 to contact the first impurity region 105a of the active region ACT. The bit line contact DC may have an upper surface at a level, substantially equal to a level of an upper surface of the first conductive pattern 141. In an example, the bit line contact DC may be integrally connected to the first conductive pattern 141, but a boundary may be distinguished from the first conductive pattern 141 according to example embodiments. In an example, the bit line contact DC may include the same material as the first conductive pattern 141, but may include a different material according to embodiments.

The bit line BL may be electrically connected to the first impurity region 105*a* through the bit line contact DC. A lower surface of the bit line contact DC may be located at a lower level than the upper surface of the substrate 101, and may be located at a higher level than the upper surface of the word line WL.

In an example embodiment, the bit line contact DC may be locally disposed in a bit line contact hole 135 formed in the substrate 101 and exposing the first impurity region 105*a*. According to embodiments, the bit line contact DC may not be disposed in the bit line contact hole 135 having a hole type, corresponding to the first impurity region 105*a*, but may be disposed in a line-type opening, or in a reverse type opening exposing a remaining region except for an island regions not vertically overlapping the first impurity region 105*a*.

A lower end of the bit line contact DC may be located at a higher level than the second material layer WL2 and lower than an upper surface of the gate capping layer 125. For example, heights of upper surfaces of the first and second regions WL2_R1 and WL2_R2 of the second material layer WL2 may be substantially the same or different, but the lower end of the bit line contact DC may be located at a higher level than each of the upper surfaces of the region WL2_R1 and the second region WL2_R2. For example, when a first upper surface of the first material portion of the first region WL2_R1 and a second upper surface of the second material portion of the second region WL2_R2 are located at different levels, the lower end of the bit line contact DC may be located at a higher level than the first upper surface and the second upper surface. Therefore, the bit line contact DC may be physically spaced apart from and electrically insulated from the second material layer WL2. Therefore, leakage current between the bit line contact DC and the second material layer WL2 may be limited and/or prevented. This may be because thickness distribution between the first and second regions WL2_R1 and WL2_R2 having different widths may be reduced by differently adjusting an impurity concentration for each region of the second material layer WL2.

A semiconductor device 100 according to example embodiments may further include a bit line contact spacer DCP. The bit line contact spacer DCP may fill a remaining portion of the bit line contact hole 135 in which the bit line contact DC is formed. The bit line contact spacer DCP may cover a first spacer 151 extending into the bit line contact hole 135. The bit line contact spacer DCP may be disposed on both side walls of the bit line contact DC. In an example embodiment, a bit line contact spacer DCP may surround side surfaces of the bit line contact DC. The bit line contact spacer DCP may be formed of an insulating material having etch selectivity with respect to the buffer layer 128. The bit line contact spacer DCP may include silicon oxide, silicon nitride, silicon oxynitride, or a combination thereof.

The spacer structures SS may be disposed on both side walls of each of the bit line structures BLS, and may extend in one direction, for example, in the Y-direction. The spacer structures SS may be disposed between the bit line structure BLS and the storage node contact 160. The spacer structures SS may be disposed to extend along side walls of the bit line BL and side walls of the bit line capping pattern BC. A pair of spacer structures SS disposed on both sides of one bit line structure BLS may have an asymmetrical shape with respect to the bit line structure BLS.

The spacer structure SS may include a first spacer 151, a second spacer 152, and an air spacer 156.

The first spacer 151 may be disposed on side walls of the bit line structures BLS. The second spacer 152 may be disposed between the first spacer 151 and the storage node contact 160. The air spacer 156 may be defined between the first spacer 151 and the second spacer 152. An upper end of the air spacer 156 may be defined by the capping insulating layer 180 disposed thereon, and may be defined by the landing pad structure LP.

The storage node contact 160 may be connected to one region of each of the plurality of active regions ACT, for example, the second impurity region 105*b*. The storage node contact 160 may be disposed between adjacent bit line structures BLS in the X-direction, in particular, between spacer structures SS on both sides of bit line structures BLS, when viewed in plan view. When viewed in plan view, the storage node contact 160 may be disposed between the word line structures WLS and between the bit line structures BLS. The storage node contact 160 may fill a space defined by adjacent bit line structures BLS in the X-direction, and adjacent insulating patterns 158 in the Y-direction. The storage node contact 160 may be provided as a plurality of storage node contacts, and the plurality of storage node contacts may be arranged in columns and rows in the X and Y-directions.

The storage node contact 160 may pass through the buffer layer 128 to electrically connect the second impurity region 105*b* of the active region ACT and the information storage structure CAP. The storage node contact 160 may be in direct contact with the second impurity region 105*b*. A lower end of the storage node contact 160 may be located at a lower level than the upper surface of the substrate 101, and may be located at a higher level than the lower surface of the bit line contact DC. The storage node contact 160 may be insulated from the bit line contact DC by the bit line contact spacer DCP.

The storage node contact 160 may be formed of a conductive material, for example, at least one of polycrystalline silicon (Si), titanium (Ti), titanium nitride (TiN), tantalum (Ta), tantalum nitride (TaN), tungsten (W), tungsten nitride (WN), or aluminum (Al). In an example embodiment, the storage node contact 160 may include a plurality of layers.

An upper end of the storage node contact 160 may be located at a lower level than an upper surface of the bit line BL.

The lower end of the storage node contact 160 may be located at a higher level than the upper surface of the second material layer WL2 and lower than the upper surface of the gate capping layer 125. For example, the heights of the upper surfaces of the first and second regions WL2_R1 and WL2_R2 of the second material layer WL2 may be substantially the same or different, but the lower end of the storage node contact 160 may be located at a higher level than each of the upper surfaces of the region WL2_R1 and the second region WL2_R2. For example, when the first upper surface of the first material portion of the first region WL2_R1 and the second upper surface of the second material portion of the second region WL2_R2 are located at different levels, the lower end of the storage node contact 160 may be located at a higher level than the first upper surface and the second upper surface. Therefore, the storage node contact 160 may be physically spaced apart from and electrically insulated from the second material layer WL2.

Therefore, leakage current between the storage node contact 160 and the second material layer WL2 may be limited and/or prevented. This may be because thickness distribution between the first region WL2_R1 and the second region WL2_R2 having different widths may be reduced by differently adjusting an impurity concentration for each region of the second material layer WL2.

The metal-semiconductor compound layer 165 may be disposed between the storage node contact 160 and the landing pad structure LP. The metal-semiconductor compound layer 165 may cover an upper surface of the storage node contact 160. The metal-semiconductor compound layer 165 may be, for example, a layer in which a portion of the storage node contact 160 is silicided. For example, the metal-semiconductor compound layer 165 may include cobalt silicide (CoSi), titanium silicide (TiSi), nickel silicide (NiSi), tungsten silicide (WSi), or other metal silicide. According to embodiments, the metal-semiconductor compound layer 165 may be omitted.

The insulating patterns 158 may be disposed on the buffer layer 128 while being spaced apart from each other in one direction, for example, the Y-direction, between the bit line structures BLS. The insulating patterns 158 may overlap the word line structures WLS in plan view. The insulating patterns 158 may separate adjacent storage node contacts 160 from each other. For example, the insulating patterns 158 may include silicon nitride.

The landing pad structure LP may be disposed between a pair of bit line structures BLS and on the storage node contact 160, to electrically connect the storage node contact 160 and the information storage structure CAP. At least a portion of the landing pad structure LP may include a portion overlapping the information storage structure CAP in plan view. The landing pad structure LP may be provided as a plurality of landing pad structures, and the plurality of landing pad structures may correspond to arrangement of the information storage structures CAP on a plane, and may be arranged in a hexagonal or honeycomb lattice pattern.

The landing pad structure LP may cover an upper surface of the metal-semiconductor compound layer 165. The landing pad structure LP may be in contact with side walls of the spacer structures SS between the spacer structures SS. The landing pad structure LP may have an asymmetrical shape due to a structure disposed thereon (e.g., the capping insulating layer 180). The asymmetrical shape may mean a shape in which left and right sides of one cross-section of the semiconductor device 100 are different from each other with respect to a central axis of a component.

The landing pad structure LP may include a conductive layer 174 and a barrier layer 172 covering lower and side surfaces of the conductive layer 174. The barrier layer 172 may cover side walls of the spacer structure SS and the upper surface of the metal-semiconductor compound layer 165. The conductive layer 174 may include a conductive material such as at least one of polycrystalline silicon (Si), titanium (Ti), tantalum (Ta), tungsten (W), or aluminum (Al). The barrier layer 172 may include a metal nitride, e.g., at least one of titanium nitride (TiN), tantalum nitride (TaN), or tungsten nitride (WN).

The capping insulating layer 180 may be disposed to contact a side wall of the landing pad structure LP. The capping insulating layer 180 may have an upper surface coplanar with an upper surface of the landing pad structure LP. The capping insulating layer 180 may be disposed to contact the bit line structure BLS, the spacer structure SS, and the landing pad structure LP. The capping insulating layer 180 may have a lower end contacting an upper surface of the spacer structure SS. The lower end of the capping insulating layer 180 may be located at a lower level than an upper end of the bit line capping pattern BC.

The information storage structure CAP may be disposed on the capping insulating layer 180 and the landing pad structures LP. The information storage structures CAP may include a lower electrode 192, an information storage dielectric layer 194, and an upper electrode 196. The lower electrode 192 and the upper electrode 196 may include at least one of a doped semiconductor, a metal nitride, a metal, or a metal oxide. The lower electrode 192 and the upper electrode 196 may include, for example, at least one of polycrystalline silicon, titanium nitride (TiN), tungsten (W), titanium (Ti), ruthenium (Ru), or tungsten nitride (WN). The information storage dielectric layer 194 may include, for example, at least one of high dielectric constant materials such as zirconium oxide ($ZrO_2$), aluminum oxide ($Al_2O_3$), or hafnium oxide ($Hf_2O_3$). In FIG. 2, the information storage structure CAP may be shown in a cylinder shape, but may not be limited thereto, and may have a pillar shape in example embodiments.

Hereinafter, various modified examples of the components of the above-described embodiment will be described. Various modified examples of the components of the above-described embodiment, which will be described below, will be described focusing on components to be modified or replaced. In addition, although components to be modified or replaced, which will be described below, are described with reference to the following drawings, components to be modified or replaced may be combined with each other or with the components described above, to configure a semiconductor device according to an embodiment may.

FIGS. 4 to 8 are plan views, cross-sectional views, and partially enlarged cross-sectional views, illustrating modified examples of a semiconductor device according to example embodiments.

Figure 4:
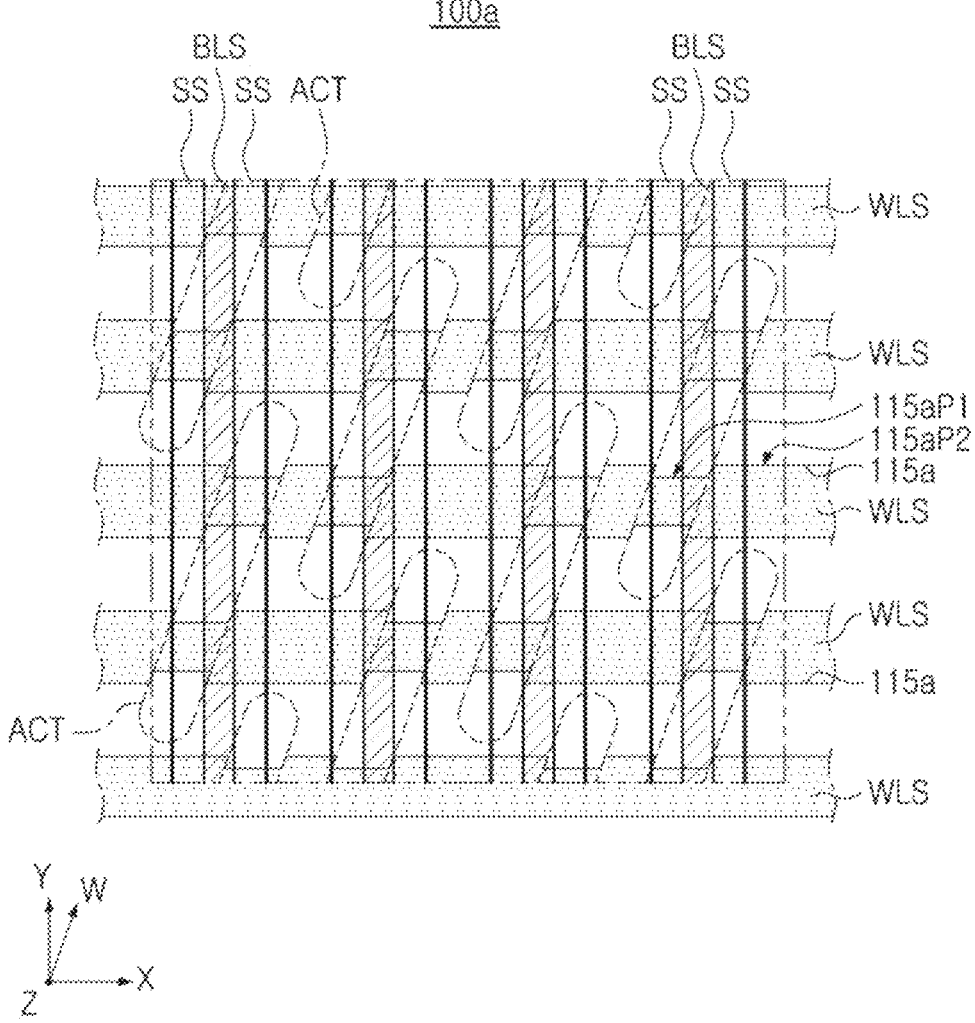
FIG. 4 is a schematic plan view of a semiconductor device according to example embodiments.

FIG. 4 is a schematic plan view of a semiconductor device according to example embodiments.

Referring to FIG. 4, gate trenches 115a of a semiconductor device 100a may include a first trench portion 115aP1 having a first width in the Y-direction and extending in the X-direction, and a second trench portion 115aP2 having a second width, wider than the first width, and extending in the X-direction. Unlike FIG. 1, the first trench portion 115aP1 may recess a plurality of active regions ACT, and the second trench portion 115aP2 may recess device isolation layers 110.

A second material layer WL2 may include a first region having a first width, and a second region having a second width, wider than the first width, in the Y-direction. The second material layer WL2 may include a doped semiconductor material. The second material layer WL2 may include a first material portion in the first region and a second material portion in the second region. The doped semiconductor material of the second material layer WL2 may have a first impurity concentration in the first material portion and a second impurity concentration, lower than the first impurity concentration, in the second material portion. Unlike FIGS. 1 to 3, in the second material layer WL2, the first material portion may be in contact with the plurality of active regions ACT, and the second material portion may be in contact with the device isolation layers 110.

Figure 5:
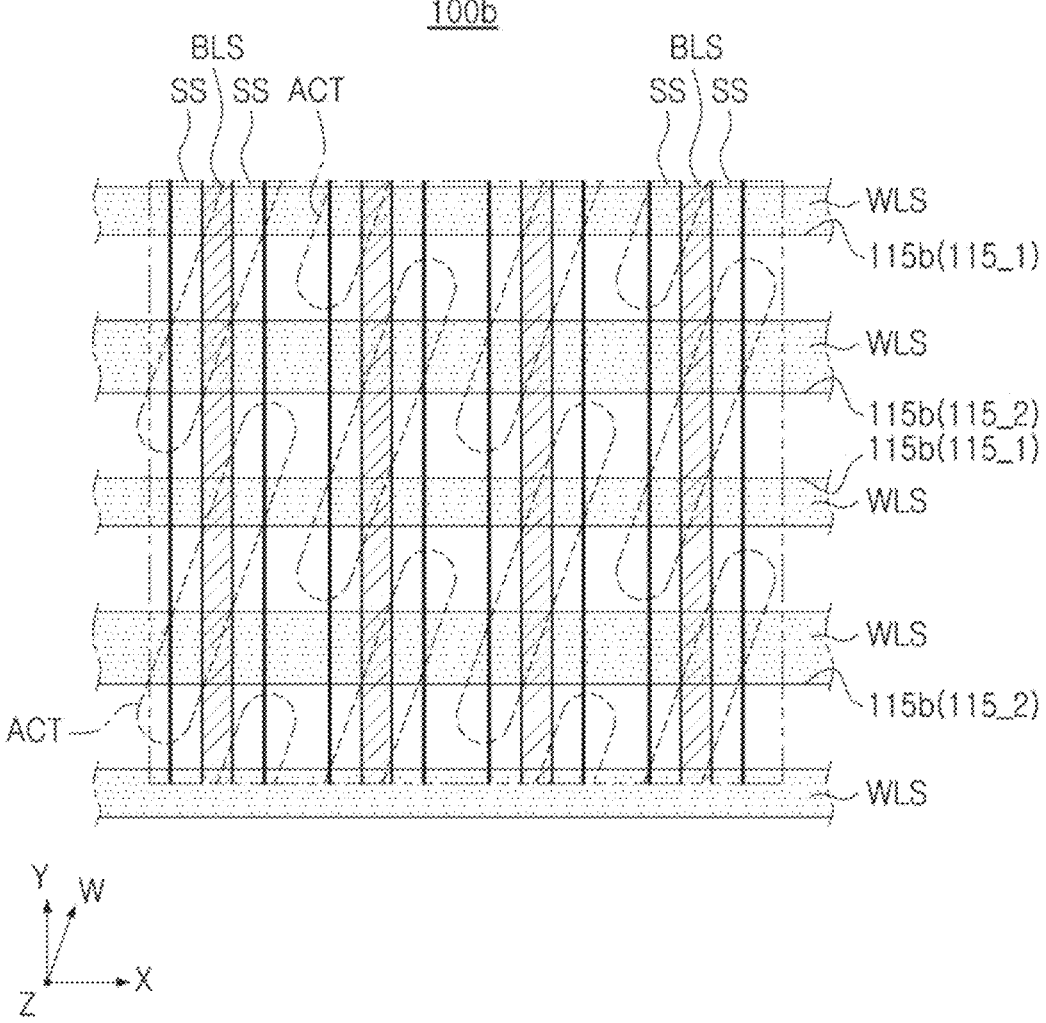
FIG. 5 is a schematic plan view of a semiconductor device according to example embodiments.

FIG. 5 is a schematic plan view of a semiconductor device according to example embodiments.

Referring to FIG. 5, gate trenches 115b of a semiconductor device 100b may include a first gate trench 115_1 and a second gate trench 115_2 extending parallel to the first gate trench 115_1. A width of the first gate trench 115_1 may be narrower than a width of the second gate trench 115_2. The first and second gate trenches 115_1 and 115_2 are illustrated as being alternately disposed in the Y-direction in FIG. 5, but are not limited thereto, and may be variously changed and disposed.

A second material layer WL2 may include a first region having a first width, and a second region having a second width, wider than the first width, in the Y-direction. The second material layer WL2 may include a doped semiconductor material. The second material layer WL2 may include a first material portion in the first region and a second material portion in the second region. The doped semiconductor material of the second material layer WL2 may have a first impurity concentration in the first material portion and a second impurity concentration, lower than the first impurity concentration, in the second material portion.

In an example embodiment, the first region of the second material layer WL2 may be located in the first gate trench 115_1, and the second region of the second material layer WL2 may be located in the second gate trench 115_2. For example, the first region may be a word line region located in a gate trench different from that of the second region.

Word lines WL may include a first word line in the first gate trench 115_1 and a second word line in the second gate trench 115_2. For example, a first doped material having a first impurity concentration may be included in a region having a first width, and the region may correspond to the first region. For example, a second doped material having a second impurity concentration, lower than the first impurity concentration, may be included in a region having a second width, wider than the first width, and the region may correspond to the second region.

Figure 6:
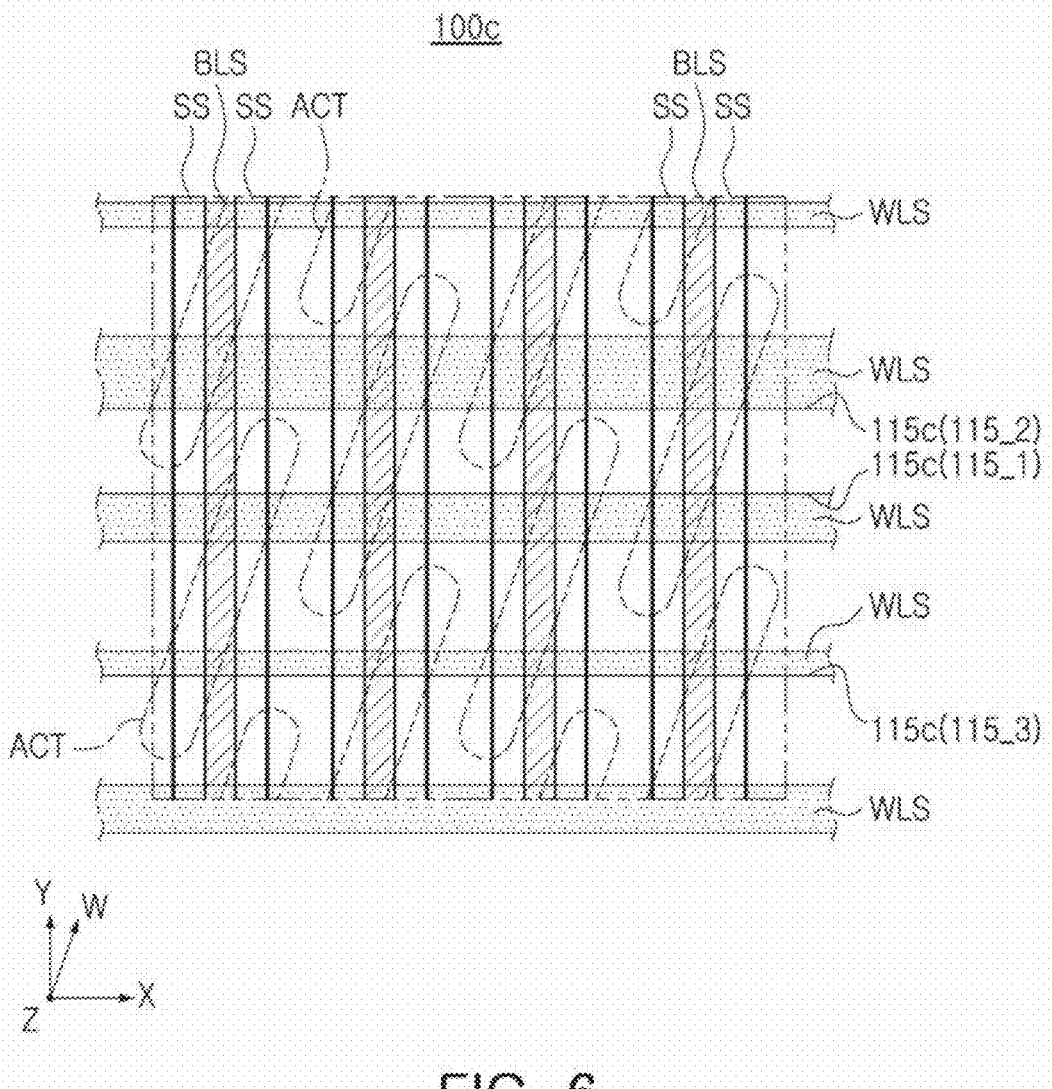
FIG. 6 is a schematic plan view of a semiconductor device according to example embodiments.

FIG. 6 is a schematic plan view of a semiconductor device according to example embodiments.

Referring to FIG. 6, gate trenches 115c of a semiconductor device 100c may include first to third gate trenches 115_1, 115_2, and 115_3 having different widths. A width of the first gate trench 115_1 may be narrower than a width of the second gate trench 115_2 and wider than a width of the third gate trench 115_3.

A second material layer WL2 may include a first region having a first width, a second region having a second width, wider than the first width, and a third region having a third width, narrower than the first width, in the Y-direction. The second material layer WL2 may include a doped semiconductor material. The second material layer WL2 may include a first material portion in the first region, a second material portion in the second region, and a third material portion in the third region. The doped semiconductor material of the second material layer WL2 may have a first impurity concentration in the first material portion, may have a second impurity concentration, lower than the first impurity concentration, in the second material portion, and may have a third impurity concentration, higher than the first impurity concentration, in the third material portion.

In an example embodiment, the first region of the second material layer WL2 may be located in the first gate trench 115_1, the second region of the second material layer WL2 may be located in the second gate trench 115_2, and the third region of the second material layer WL2 may be located in the third gate trench 115_3.

In the example embodiment, the number of gate trenches having different widths are illustrated as being three, but the gate trenches are not limited thereto, and may include more gate trenches. Even in this case, an impurity concentration in a trench having a relatively narrow width may be relatively high.

Figure 7:
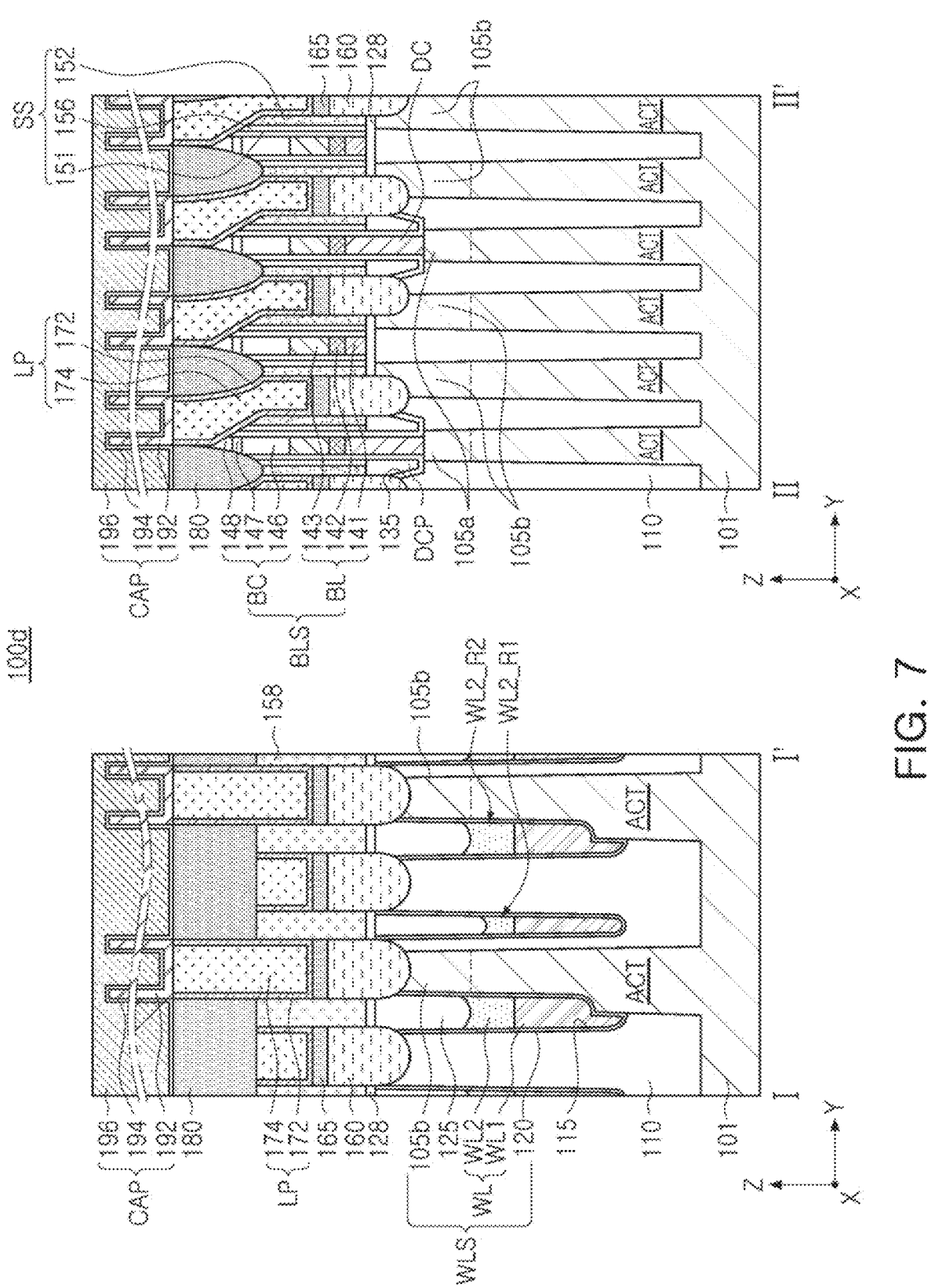
FIG. 7 is schematic cross-sectional views of a semiconductor device according to example embodiments.

FIG. 7 is schematic cross-sectional views of a semiconductor device according to example embodiments. FIG. 7 illustrates regions corresponding to cross-sectional views of FIG. 1, taken along lines I-I' and Referring to FIG. 7, in a second material layer WL2 of a semiconductor device 100d, a thickness of a second region WL2_R2 may be different from a thickness of a first region WL2_R1. For example, an upper end of the second material layer WL2 may be changed for each region. For example, the thickness of the second region WL2_R2 may be thicker than the thickness of the first region WL2_R1. This may be a case in which a first impurity concentration relatively increases, compared to FIG. 2. When the first impurity concentration relatively decreases, compared to FIG. 2, the thickness of the second region WL2_R2 may be thinner than the thickness of the first region WL2_R1. For example, a difference between a first impurity concentration and a second impurity concentration may be controlled to adjust thickness distribution of each region of the second material layer WL2 according to a width.

Figure 8:
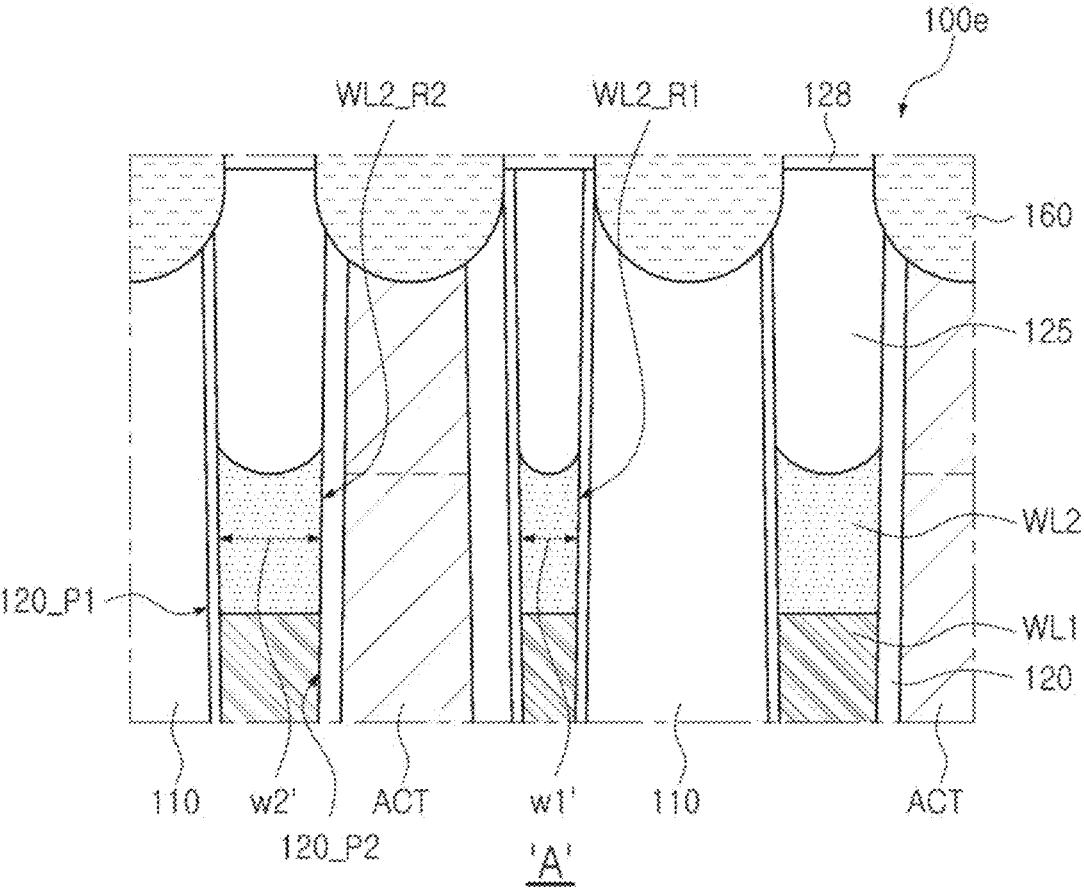
FIG. 8 is a partially enlarged cross-sectional view of a semiconductor device according to example embodiments.

FIG. 8 is a partially enlarged cross-sectional view of a semiconductor device according to example embodiments. FIG. 8 is an enlarged view of a region corresponding to portion 'A' of FIG. 2.

Referring to FIG. 8, a semiconductor device 100e may have a gate dielectric layer 120, different from that of FIGS. 2 and 3. The gate dielectric layer 120 may include a first portion 120_P1 contacting device isolation layers 110, and a second portion 120_P2 contacting a plurality of active regions ACT. A thickness of the first portion 120_P1 may be different from a thickness of the second portion 120_P2. For example, the thickness of the first portion 120_P1 may be thinner than the thickness of the second portion 120_P2. This may be because a dielectric layer is relatively easily formed in the plurality of active regions ACT when an oxidation process is used as a process for forming the gate dielectric layer 120.

A second material layer WL2 may fill a remaining space in gate trenches 115 except for a region covered by the gate dielectric layer 120. Therefore, a width of the second material layer WL2 in the Y-direction may be determined by the remaining space, regardless of widths of the gate trenches 115. In this case, the second material layer WL2 may include a first region WL2_R1 having a first width w1' in the Y-direction, and a second region WL2_R2 having a second width w2', wider than the first width w1', in the Y-direction, and a first impurity concentration of the first region WL2_R1 may be higher than a second impurity concentration of the second region WL2_R2.

FIGS. 9A to 9F are schematic cross-sectional views and partially enlarged cross-sectional views illustrating a method of manufacturing a semiconductor device according to example embodiments.

Figure 9A:
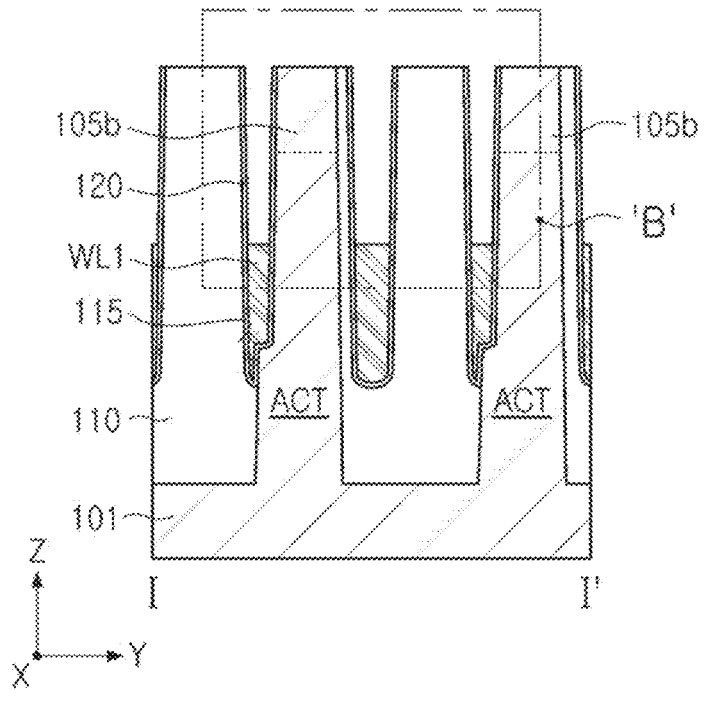
FIGS. 9A to 9F are schematic cross-sectional views and partially enlarged cross-sectional views illustrating a method of manufacturing a semiconductor device according to example embodiments.
Figure 9B:
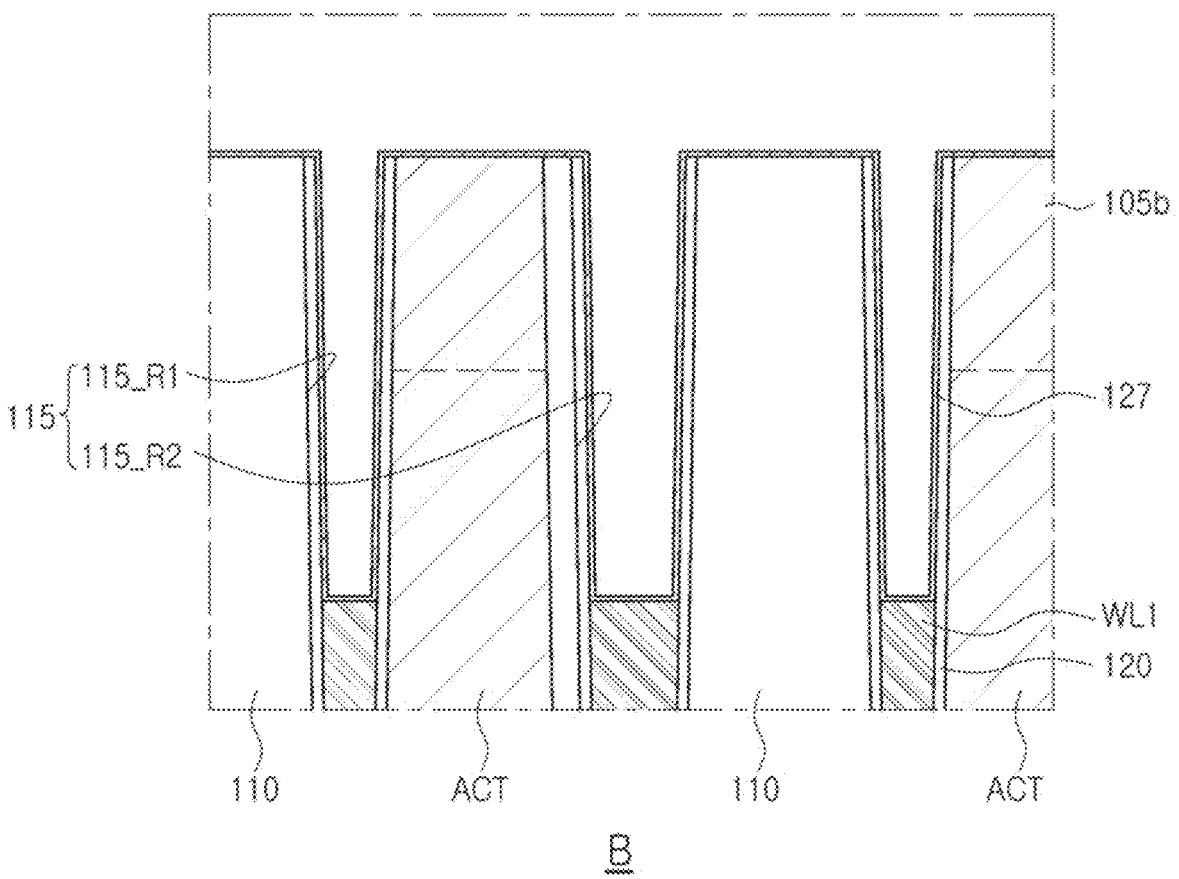

Referring to FIGS. 9A and 9B, device isolation layers 110 defining a plurality of active regions ACT may be formed in a substrate 101, gate trenches 115 may be formed in the substrate 101, and, a gate dielectric layer 120, a first material layer WL1, and a first semiconductor layer 127 may be formed in the gate trenches 115.

First, according to a shallow trench isolation (STI) process, a substrate 101 may be anisotropically etched to form trenches, insulating materials may be deposited in the trenches, and then device isolation layers 110 may be formed by performing a planarization process. Before forming the device isolation layers 110, impurities may be implanted into the substrate 101 to form impurity regions 105*a* and 105*b* (see FIG. 2). According to example embodiments, the impurity regions 105*a* and 105*b* may be formed after forming the device isolation layers 110 or in another process.

Next, the substrate 101 may be anisotropically etched to form gate trenches 115 in which word lines WL (see FIG. 2) are disposed. The gate trenches 115 may extend in the X-direction, and may cross a plurality of active regions ACT and the device isolation layers 110. As described in FIGS. 1 to 6, the gate trenches 115 may include regions having different widths. For example, the gate trenches 115 may have a first trench region 115_R1 and a second trench region 115_R2 having a width, wider than a width of than the first trench region 115_R1.

An oxidation process or a deposition process may be performed in the gate trenches 115 to form a gate dielectric layer 120. The gate dielectric layer 120 may be formed to have a substantially uniform thickness on inner side walls and bottom surfaces of the gate trenches 115.

Next, a first material layer WL1 may be formed by depositing a metal material and recessing the same by a desired and/or alternatively predetermined depth from the top. The metal material may include, for example, at least one of titanium (Ti), titanium nitride (TiN), tantalum (Ta), tantalum nitride (TaN), tungsten (W), tungsten nitride (WN), or aluminum (Al).

Next, a semiconductor material including an impurity may be deposited in the gate trenches 115 to form a first semiconductor layer 127. The semiconductor material may include, for example, polycrystalline silicon, and the impurity may include phosphorus or arsenic. The first semiconductor layer 127 may be formed to have a substantially uniform thickness on a side surface of the gate dielectric layer 120 and an upper surface of the first material layer WL1. The first semiconductor layer 127 may include the impurity at a first concentration.

Figure 9C:
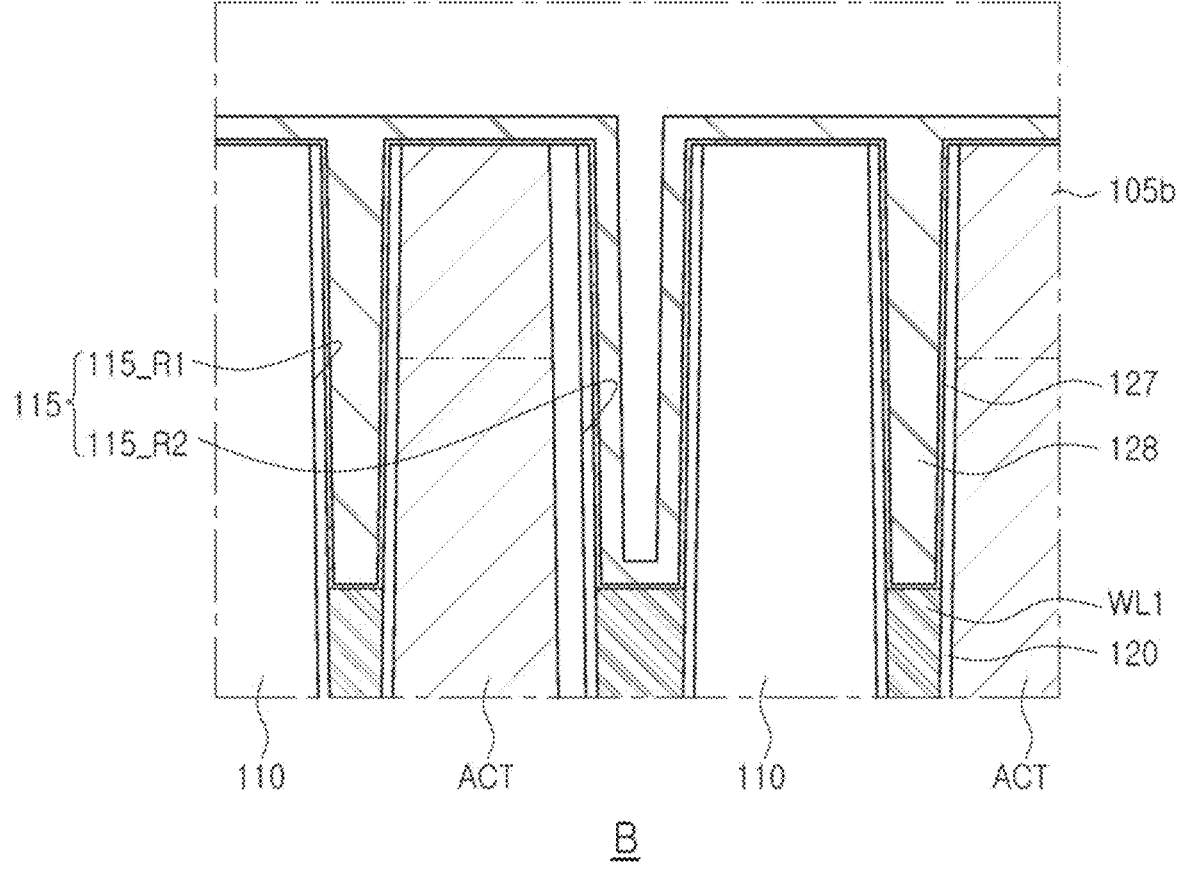

Referring to FIG. 9C, a second semiconductor layer 128 may be formed in the gate trenches 115.

A second semiconductor layer 128 conformally covering the first semiconductor layer 127 in the gate trenches 115 may be formed by performing a deposition process. The second semiconductor layer 128 may include a semiconductor material and an impurity, identical to those of the first semiconductor layer 127. The second semiconductor layer 128 may include the impurity at a second concentration, higher than the first concentration. The second semiconductor layer 128 may be formed to have a relatively thin thickness not to fill at least a portion of the gate trenches 115. In an example embodiment, the second semiconductor layer 128 may be formed to have a conformal thickness such that a region of the gate trenches 115 having a relatively thin width (e.g., the first trench region 115_R1) is entirely filled and a region of the gate trenches 115 having a relatively thick width (e.g., the second trench region 115_R2) is partially empty.

Figure 9D:
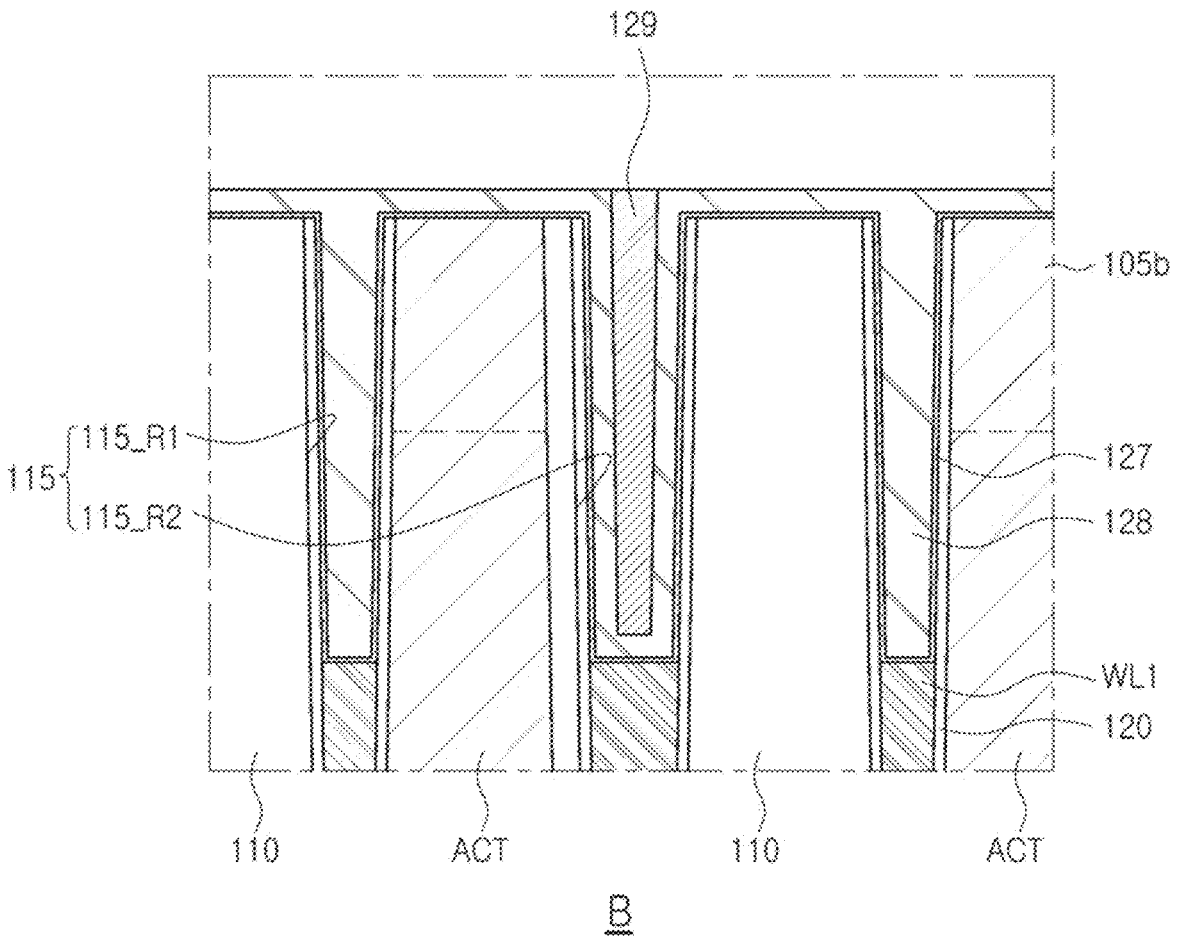

Referring to FIG. 9D, a third semiconductor layer 129 may be formed in the gate trenches 115.

A deposition process may be performed to form a third semiconductor layer 129 conformally covering the second semiconductor layer 128 in the gate trenches 115, and a planarization process may be performed to remove a portion of the third semiconductor layer 129 on the second semiconductor layer 128. The third semiconductor layer 129 may fill, for example, an empty region in the gate trenches 115. The third semiconductor layer 129 may include a semiconductor material and an impurity, identical to those of the second semiconductor layer 128. The third semiconductor layer 129 may include the impurity at a third concentration, lower than the second concentration.

Figure 9E:
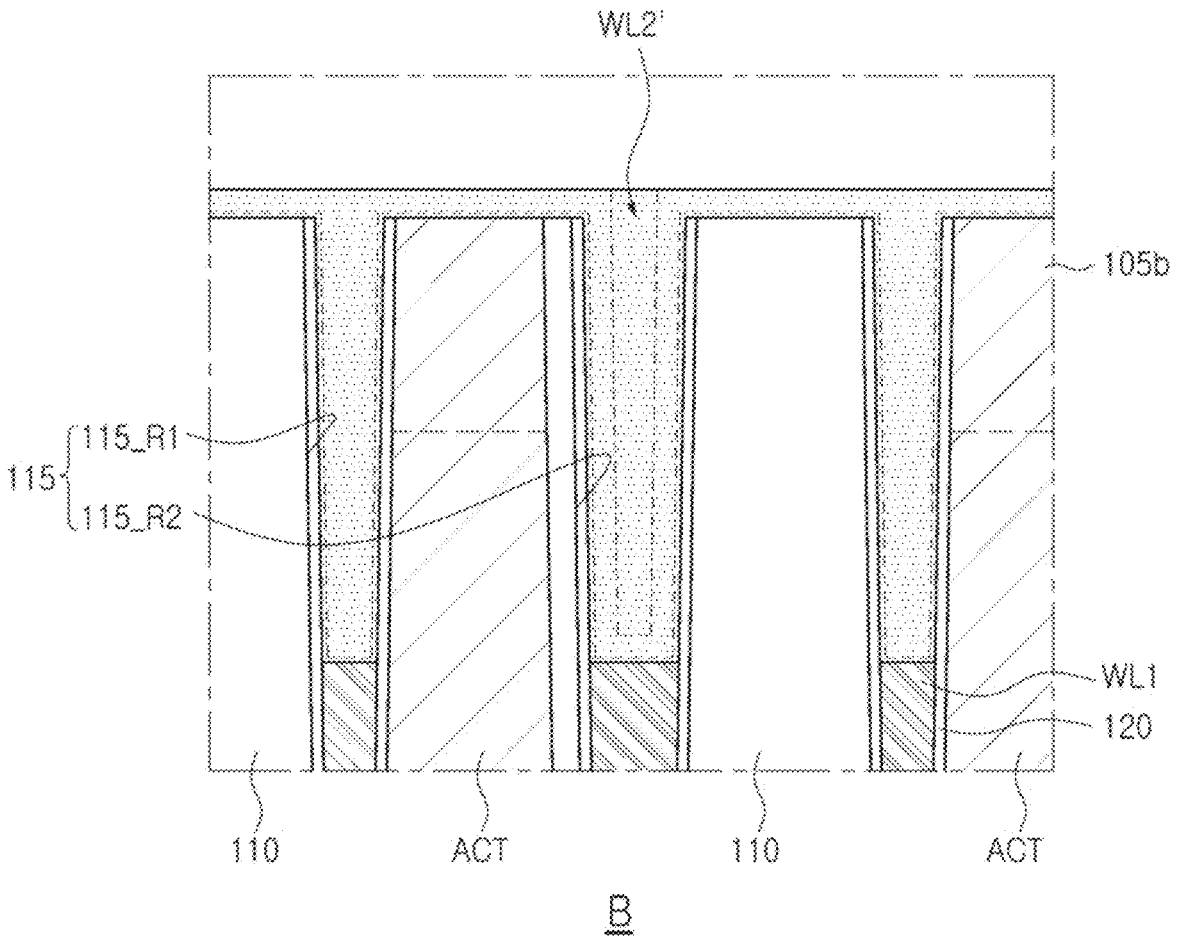

Referring to FIG. 9E, a preliminary second material layer WL2' may be formed.

As the impurities in the first to third semiconductor layers 127, 128, and 129 are diffused, a preliminary second material layer WL2' with unclear boundaries between the first to third semiconductor layers 127, 128, and 129 may be formed. For example, the preliminary second material layer WL2' may be a layer integrally formed in regions corresponding to the first to third semiconductor layers 127, 128, and 129. The preliminary second material layer WL2' may be formed in an operation of performing a deposition process or a planarization process according to FIGS. 9B to 9D, but is not limited thereto, and may be form by progressing diffusion gradually by a subsequent process. The preliminary second material layer WL2' in the gate trenches 115 may include a first region having a first width, and a second region having a second width, wider than the first width, in the Y-direction. A first impurity concentration in the first region may be higher than a second impurity concentration in the second region. This may be because the second semiconductor layer 128 doped with a high concentration is thinly formed and the third semiconductor layer 129 doped with a low concentration is additionally formed, in the second region having a relatively wide width.

Figure 9F:
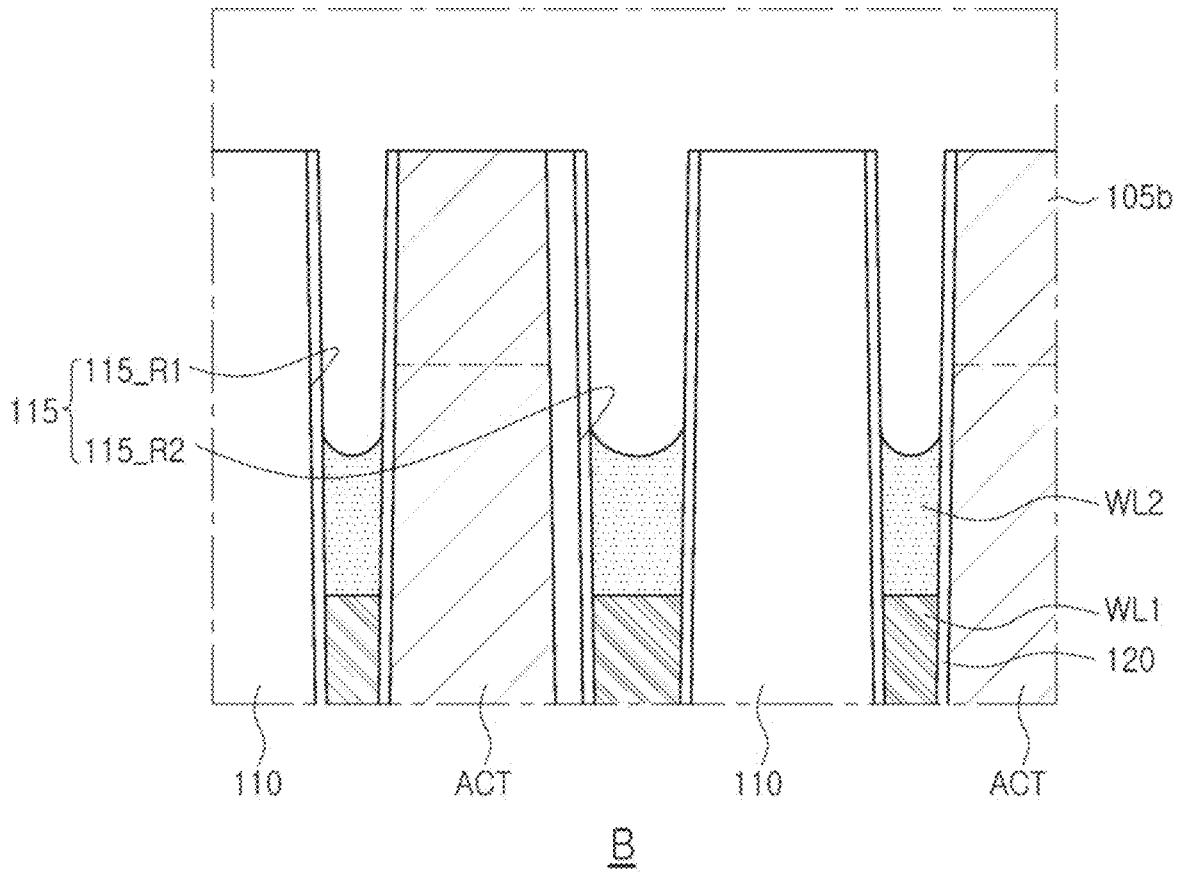

Referring to FIG. 9F, a second material layer WL2 may be formed.

An etching process or an etch-back process may be performed on the preliminary second material layer WL2' to recess the preliminary second material layer WL2' by a desired and/or alternatively predetermined depth from the top, to form a second material layer WL2.

In the etching process, as the preliminary second material layer WL2' of the second region having a relatively wide width has a relatively low concentration of the second impurity, the preliminary second material layer WL2' of the second region may be limited and/or prevented from being over-etched. Therefore, the second material layer WL2 may have substantially constant or similar upper end height, even in regions having different widths.

Next, referring to FIG. 2, a word line structure WLS may be prepared by forming a gate capping layer 125 filling the gate trenches 115, bit line structures BLS may be prepared on the substrate 101, a spacer structure SS may be prepared on both side walls of the bit line structures BLS, insulating patterns 158 and a storage node contact 160 may be prepared, a landing pad structure LP and a capping insulation layer 180 may be prepared, and an information storage structure (CAP) may be then prepared.

An impurity concentration of a word line for each region in a gate trench may be differently controlled to adjust thickness distribution of the word line, to provide a semiconductor device having improved productivity.

Various features, aspects, and effects of inventive concepts are not limited to the above, and will be more easily understood in the process of describing specific embodiments of inventive concepts.

While example embodiments have been shown and described above, it will be apparent to those skilled in the art that modifications and variations could be made without departing from the scope of inventive concepts as defined by the appended claims.

15 16

What is claimed is:

1. A semiconductor device comprising:
a substrate including an active region;
a device isolation layer on the substrate and defining the active region; and
a word line structure crossing the active region and the device isolation layer, the word line structure being in a gate trench extending in a first horizontal direction, wherein
the gate trench is defined by the device isolation layer and the active region,
the word line structure includes a gate dielectric layer and a word line,
the gate dielectric layer is on an inner wall of the gate trench,
the word line is on the gate dielectric layer and partially fills the gate trench,
the word line includes a first material layer and a second material layer on the first material layer,
the second material layer includes a doped semiconductor material,
the word line has a first region having a first width and a second region having a second width,
the second width is wider than the first width,
the second material layer includes a first material portion in the first region and a second material portion in the second region,
the doped semiconductor material of the second material layer has a first impurity concentration in the first material portion and a second impurity concentration in the second material portion, and
the second impurity concentration is lower than the first impurity concentration, wherein
the gate trench includes a first trench portion extending with a first lateral width and a second trench portion extending with a second lateral width,
the second lateral width is wider than the first lateral width,
the first region of the word line is in the first trench portion, and
the second region of the word line is in the second trench portion.

2. The semiconductor device of claim 1, wherein the doped semiconductor material is polycrystalline silicon containing phosphorus (P) or arsenic (As).

3. The semiconductor device of claim 1, wherein the first impurity concentration and the second impurity concentration each range from $1.0 \times 10^{18}/cm^3$ to $1.0 \times 10^{22}/cm^3$.

4. The semiconductor device of claim 1, wherein an etching rate of a material of the first material portion is a faster than an etching rate of a material of the second material portion.

5. The semiconductor device of claim 1, wherein
the word line has a third region having a third width,
the third width is wider than the first width and narrower than the second width,
the second material layer includes a third material portion in the third region,
the doped semiconductor material of the second material layer has a third impurity concentration in the third material portion, and
the third impurity concentration is lower than the first impurity concentration and higher than the second impurity concentration.

6. The semiconductor device of claim 1, wherein
the device isolation layer is recessed in the first trench portion, and
the active region is recessed in the second trench portion.

7. The semiconductor device of claim 1, wherein
the first material portion is adjacent to the device isolation layer, and
the second material portion is adjacent to the active region.

8. The semiconductor device of claim 1, wherein
the first trench portion and the second trench portion are provided as a plurality of first trench portions and a plurality of second trench portions, respectively, and
the plurality of first trench portions and the plurality of second trench portions are alternately arranged along the gate trench.

9. The semiconductor device of claim 1, wherein a thickness of the second material layer in the first region is different from a thickness of the second material layer in the second region.

10. The semiconductor device of claim 1, wherein a thickness of the first material layer is thicker than a thickness of the second material layer.

11. The semiconductor device of claim 1, wherein
the active region and the device isolation layer are recessed by the gate trench, and
the gate dielectric layer includes a first portion contacting the device isolation layer and a second portion contacting the active region, and
a thickness of the first portion is different from a thickness of the second portion.

12. The semiconductor device of claim 11, wherein the thickness of the first portion is thinner than the thickness of the second portion.

13. A semiconductor device comprising:
a substrate including an active region, the active region including a first impurity region and a second impurity region;
a device isolation layer on a side surface of the active region, the device isolation layer and the active region defining gate trenches crossing the active region and the device isolation layer, the gate trenches extending in a first horizontal direction;
word line structures including word lines in the gate trenches;
a bit line structure crossing the word lines and electrically connected to the first impurity region, a height level of the bit line structure being different from height levels of the word lines;
a storage node contact electrically connected to the second impurity region; and
an information storage structure electrically connected to the storage node contact, wherein
the gate trenches include a first gate trench and a second gate trench,
the word lines include a first word line in the first gate trench and a second word line in the second gate trench,
the first word line includes a first doped material having a first impurity concentration in a region having a first width, and
the second word line includes a second doped material having a second impurity concentration in a region having a second width,
the second impurity concentration is lower than the first impurity concentration, and the second width is wider than the first width.

14. The semiconductor device of claim 13, wherein
the region having the second width in the second word
line is adjacent to the active region, and
the region having the first width in the first word line is
adjacent to the device isolation layer.

15. The semiconductor device of claim 13, wherein
a first upper surface of the first word line is located at a
different level than a second upper surface of the
second word line, and
a lower end of the storage node contact is located at a
higher level than the first upper surface and the second
upper surface.

16. The semiconductor device of claim 13, wherein
the first word line includes a first material layer and a
second material layer below the first material layer,
the first material layer includes the first doped material,
the second material layer includes a conductive material,
a resistivity of the conductive material of the second
material layer is lower than a resistivity of the first
doped material, and the second word line includes a
third material layer and a fourth material layer below
the third material layer,
the third material layer includes the second doped mate-
rial, and
the fourth material layer includes the conductive material.

17. The semiconductor device of claim 16, wherein
the first doped material is first doped polycrystalline
silicon, and
the second doped material is second doped polycrystalline
silicon.

18. A semiconductor device comprising:
a substrate including a plurality of active regions, the
substrate including gate trenches partially recessed
from an upper portion of the substrate and extending in
a first horizontal direction;
dielectric patterns on an inner side wall of each of the gate
trenches;
first gate electrode patterns on the dielectric patterns in the
gate trenches, the first gate electrode patterns including
a metal material;
second gate electrode patterns on the first gate electrode
patterns in the gate trenches, the second gate electrode
patterns having a semiconductor material including an
impurity; and
gate capping patterns on the second gate electrode pat-
terns in the gate trenches, wherein
the second gate electrode patterns have a first region and
a second region,
the first region has a first width,
the second region has a second width,
the second width is wider than the first width,
an impurity in the first region is identical to an impurity
of the second region, and
an impurity concentration in the first region is different
from an impurity concentration in the second region,
wherein
the impurity concentration of the first region is higher
than the impurity concentration of the second region.

* * * * *